US009091736B2

United States Patent
Kadirvel et al.

(10) Patent No.: US 9,091,736 B2
(45) Date of Patent: Jul. 28, 2015

(54) SYSTEMS AND METHODS OF BATTERY CELL ANOMALY DETECTION

(75) Inventors: Karthik Kadirvel, Gainesville, FL (US); Umar Jameer Lyles, Palm Bay, FL (US); John H. Carpenter, Jr., Palm Bay, FL (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1556 days.

(21) Appl. No.: 12/349,039

(22) Filed: Jan. 6, 2009

(65) Prior Publication Data
US 2010/0173183 A1 Jul. 8, 2010

(51) Int. Cl.
*G01N 27/416* (2006.01)
*G01R 31/36* (2006.01)
*H02J 7/00* (2006.01)

(52) U.S. Cl.
CPC ........... *G01R 31/3658* (2013.01); *H02J 7/0021* (2013.01)

(58) Field of Classification Search
CPC ................. G01R 31/3658; G01R 31/3624
USPC ............. 307/150; 340/636.1, 636.12, 636.13, 340/636.15, 636.19; 324/434; 429/92, 93; 702/63
See application file for complete search history.

(56) References Cited

U.S. PATENT DOCUMENTS

| | | | | |
|---|---|---|---|---|
| 5,302,902 A * | 4/1994 | Groehl | ............................ | 324/434 |
| 5,313,152 A * | 5/1994 | Wozniak et al. | ............... | 320/118 |
| 5,677,077 A * | 10/1997 | Faulk | ............................... | 429/90 |
| 5,705,914 A * | 1/1998 | Morita | ...................... | 340/636.17 |
| 6,020,718 A * | 2/2000 | Ozawa et al. | .................. | 320/116 |
| 6,091,226 A * | 7/2000 | Amano | ........................... | 320/116 |
| 6,388,423 B1 * | 5/2002 | Schilleci, Jr. | .................. | 320/122 |
| 6,956,356 B2 * | 10/2005 | Elder | ............................ | 320/134 |
| 7,239,184 B2 * | 7/2007 | Cetrulo et al. | ................. | 327/103 |
| 2007/0285083 A1 * | 12/2007 | Kamata | .......................... | 324/120 |
| 2009/0009177 A1 * | 1/2009 | Kim et al. | ...................... | 324/434 |
| 2009/0179650 A1 * | 7/2009 | Omagari | ........................ | 324/433 |
| 2010/0194345 A1 * | 8/2010 | Li | ................................... | 320/134 |
| 2010/0289497 A1 * | 11/2010 | Lum-Shue-Chan et al. | .. | 324/426 |

FOREIGN PATENT DOCUMENTS

DE 10260373 A1 * 6/2004

OTHER PUBLICATIONS

Machine translation (from the EPO Website) of DE10260373A1.*

* cited by examiner

*Primary Examiner* — Fritz M Fleming
(74) *Attorney, Agent, or Firm* — William B. Kempler; Frank D. Cimino

(57) ABSTRACT

Systems and methods for cell anomaly detection are provided. The disclosed systems and methods of cell anomaly detection may use a single circuit to detect both cell-open and imbalance conditions. Disclosed embodiments may incorporate a continuous or a sampled time system (i.e. cell anomaly detection is performed when an enable signal is active). An example embodiment includes receiving voltages of a plurality of cells of a battery pack; converting the received voltages to currents; determining a maximum current of the currents; determining whether at least one of the currents is anomalous; and reporting the at least one anomalous current as indicative of a bad cell.

17 Claims, 5 Drawing Sheets

SYSTEMS AND METHODS OF BATTERY CELL ANOMALY DETECTION

TECHNICAL FIELD

The present disclosure is generally related to electronics and, more particularly, is related to charge storage monitoring systems and methods.

BACKGROUND

Charge storage monitoring systems for monitoring a plurality of battery cells, as an example, may often identify and compute individual cell and battery bank operating parameters. Other charge storage may include fuel cells, battery cells of any chemistry, and super capacitors, among others. It may be advantageous to determine a battery cell anomaly, a condition in which one or more cells has characteristics that are outside of acceptable ranges of properly operating cells, such as over voltage (OV), under voltage (UV), and over current (OC). These systems often comprise a controller, a multiplexer, an analog board, a voltage sensor circuit, and a control board. The controller is configured for designating a given battery cell to be monitored. The multiplexer is responsive to designation by the controller for selecting a given battery cell to be monitored or for selecting a battery pack to be monitored. The analog board is for receiving electrical signals from a given battery cell for providing an output representing measurement of a parameter (voltage, temperature, and the like) of the given battery cell. The voltage sensor circuit is for sensing voltage appearing across positive and negative terminals of the battery pack. The control board is responsive to address information for selectively initiating a load test, battery bank charging, or common-mode voltage measurement, for example. Monitoring systems have also been devised to detect over voltage (OV) conditions in battery packs. These OV detection systems may often include a reference and a comparator to sense the OV condition.

SUMMARY

Example embodiments of the present disclosure provide cell anomaly detection. Briefly described, in architecture, one example embodiment of the system, among others, can be implemented as follows: a plurality of voltage to current (V-to-I) converters; a plurality of inputs, each input of the plurality of inputs associated with one of the plurality of V-to-I converters; and a cell detector circuit coupled to each of the plurality of V-to-I converters, wherein the cell detector circuit determines if any of the plurality of V-to-I converters provides an anomalous input current and determines which of the plurality of V-to-I converters provides the anomalous input current.

Embodiments of the present disclosure can also be viewed as providing methods for cell anomaly detection. In this regard, one embodiment of such a method, among others, can be broadly summarized by the following: receiving voltages of a plurality of cells of a battery pack; converting the received voltages to currents; data processing the currents; determining whether at least one of the currents is anomalous; and reporting the at least one anomalous current as indicative meeting a failure criterion.

DETAILED DESCRIPTION

Figure 1:
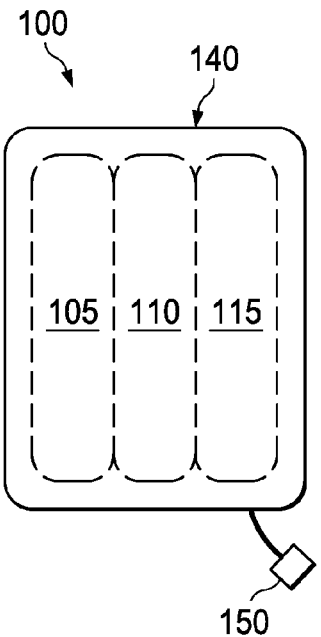
FIG. 1 is a block diagram of an example embodiment of a battery pack with over voltage and cell anomaly detection.

Embodiments of the present disclosure will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

This disclosure provides a solution to the problem of detecting anomalies in a battery by detecting a broken connection in any battery cell and by detecting when one of the cell is grossly imbalanced from the remaining cells in a multi-cell battery, i.e. detecting when the voltage across one of the cells is different from the other cells by a predetermined amount.

With existing OV detection circuits, the OV detection circuitry may not be designed to also detect a cell open condition. An over voltage condition is normally determined by sensing the voltage across a voltage divider. However, as there is no change in the voltage across the resistive divider when experiencing an open cell condition, the OV detection circuit cannot also be used to determine the open cell condition.

This disclosure provides a solution to the problem of detecting anomalies in a battery by detecting a broken connection in any battery cell and by detecting when one of the cell is grossly imbalanced from the remaining cells in a multi-cell battery, i.e. detecting when the voltage across one of the cells is different from the other cells by a predetermined amount.

Example embodiments of systems and methods of cell anomaly detection may detect a cell-open condition or a deep cell imbalance. A cell open condition may be defined as having an input resistance (Rin) greater than a predetermined amount, such as a non-limiting example, 50 kOhms, due to manufacturing or some abnormal condition. A deep cell imbalance may be defined as a condition in which one of the cell voltages is different from the other by a predetermined amount. In one example, this threshold may be set at 50%. This functionality may be useful in the next generation of 2nd level OV protectors.

As part of the overvoltage protection circuitry, a resistive divider may be connected across each cell to measure the cell voltage. When one of the connections to the cell is broken, the node voltage between the cells does not change because of the presence of the voltage divider circuitry. Hence, existing OV detection circuitry may not detect a cell-open condition as there is no change in the voltage across the resistive divider.

The disclosed systems and methods of cell anomaly detection may use a single circuit to detect both cell-open and imbalance conditions. The disclosed circuit may exhibit extremely low average current consumption. The trip levels for the cell imbalance and open detection may be programmable. The systems and methods may be scalable to any number of cells as the signal processing may be performed in the current domain.

In one example embodiment, the output of each of the cells is a current signal. This may be a key advantage in a multi-cell battery pack as it allows the information across a cell to be transmitted to a ground referenced circuit which can then manipulate the current signal for further processing. The ground referenced circuit may allow for a direct cell to cell comparison. This may reduce the number of high voltage circuit components which in turn may reduce the die area. Additionally, due to the circuit being ground-referenced, the circuit may be designed without high-voltage components, using all low-voltage components.

Disclosed embodiments may incorporate a sampled time system (i.e cell anomaly detection is performed when an enable signal is active). This allows for a considerable reduction in power consumption. Furthermore, this also allows an external microprocessor to control the frequency at which cell anomaly detection is performed. Example embodiments may also be continuous sampling, continuously enabled.

FIG. 1 provides battery pack 100 incorporating an example embodiment of systems and methods of battery cell anomaly detection. Battery pack 100 includes cells 105, 110, 115. Although three cells are shown in this example embodiment, any number of cells could be used. Battery pack 100 also includes circuit 140 and connector 150. Connector 150 is shown as a wired connector; however, connector 150 may also comprise contacts positioned on battery pack 100 to connect into a circuit in a device.

Figure 2:
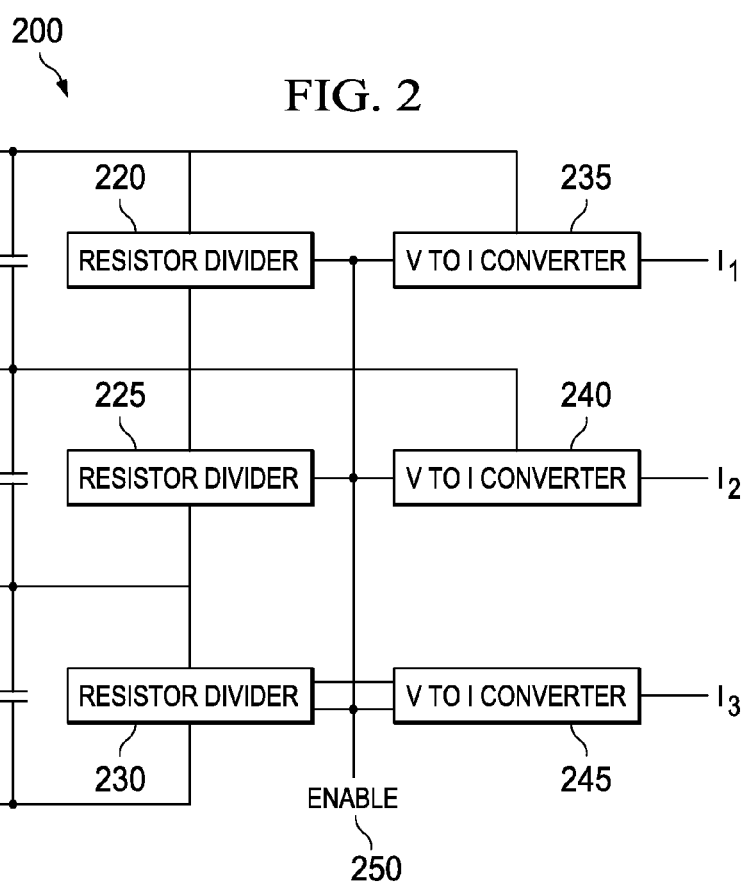
FIG. 2 is a circuit diagram of an example embodiment of a sensing circuit of the battery pack of FIG. 1.

Circuit 140 is described in more detail in FIG. 2. Circuit 200 comprises cell1 205, cell2 210, cell3 215, resistor dividers 220, 225, 230 and voltage to current (V-to-I) converters 235, 240, 245. Circuit 200 consists of a multi-cell battery consisting of 3 cells 205, 210, 215 in series. Although three cells are shown, any number of cells may be used. Cells 205, 210, 215 may be connected to the integrated circuit (IC) through an input resistance and an input capacitor. Disclosed example embodiments may be used in a 2nd level overvoltage protection integrated circuit. A high valued resistive divider 220, 225, 230 (e.g., 15 MOhm) may be presented across each cell 205, 210, 215 as part of a 2nd level overvoltage protection circuitry. As part of this solution, V-to-I converter 235, 240, 245 is connected across each cell 205, 210, 215 respectively. The output current of the V-to-I converter across each cell is denoted by I1, I2, and I3. Each V-to-I converter 235, 240, 245 is connected to cells 205, 210, 215 with enable signal 250.

Figure 3:
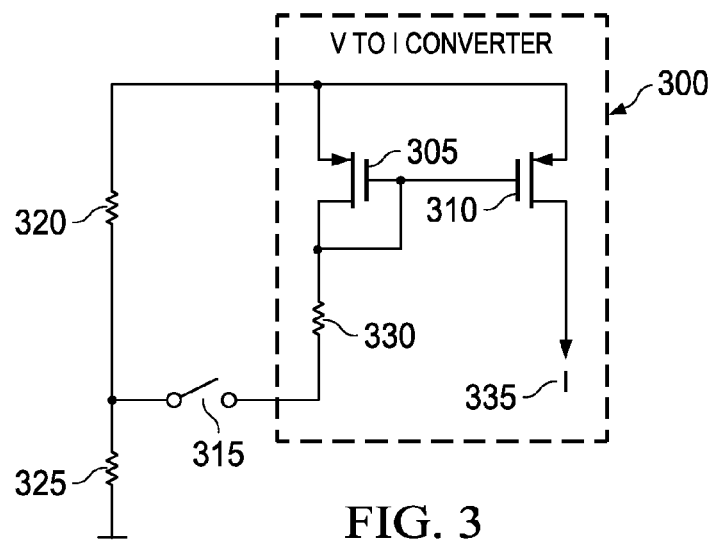
FIG. 3 is a circuit diagram of an example embodiment of a voltage to current converter of the battery pack of FIG. 1.

FIG. 3 provides the voltage to current converter of FIG. 2 in more detail. Voltage to current converter 300 comprises transistors 305, 310, resistor 330, and output 335. Voltage to current converter 300 is connected to resistor divider 320 and 325 through enable switch 315. Enable switch 315 may be periodically enabled, or continuously enabled. The periodic enablement may be synchronous or asynchronous, and the length of time of each enablement may be set, varied, or configurable. Transistors 310 and 305 are used to mirror the current that flows through resistor 330. Transistors 305 and 310 are shown as field effect transistors, but may be other types as transistors as well, such as another non-limiting example of bipolar transistors. The current through resistor 330 is set by the resistor divider formed by resistors 320 and 325. In an example embodiment there is one V-to-I converter and associated enable switch and resistor divider.

Figure 4:
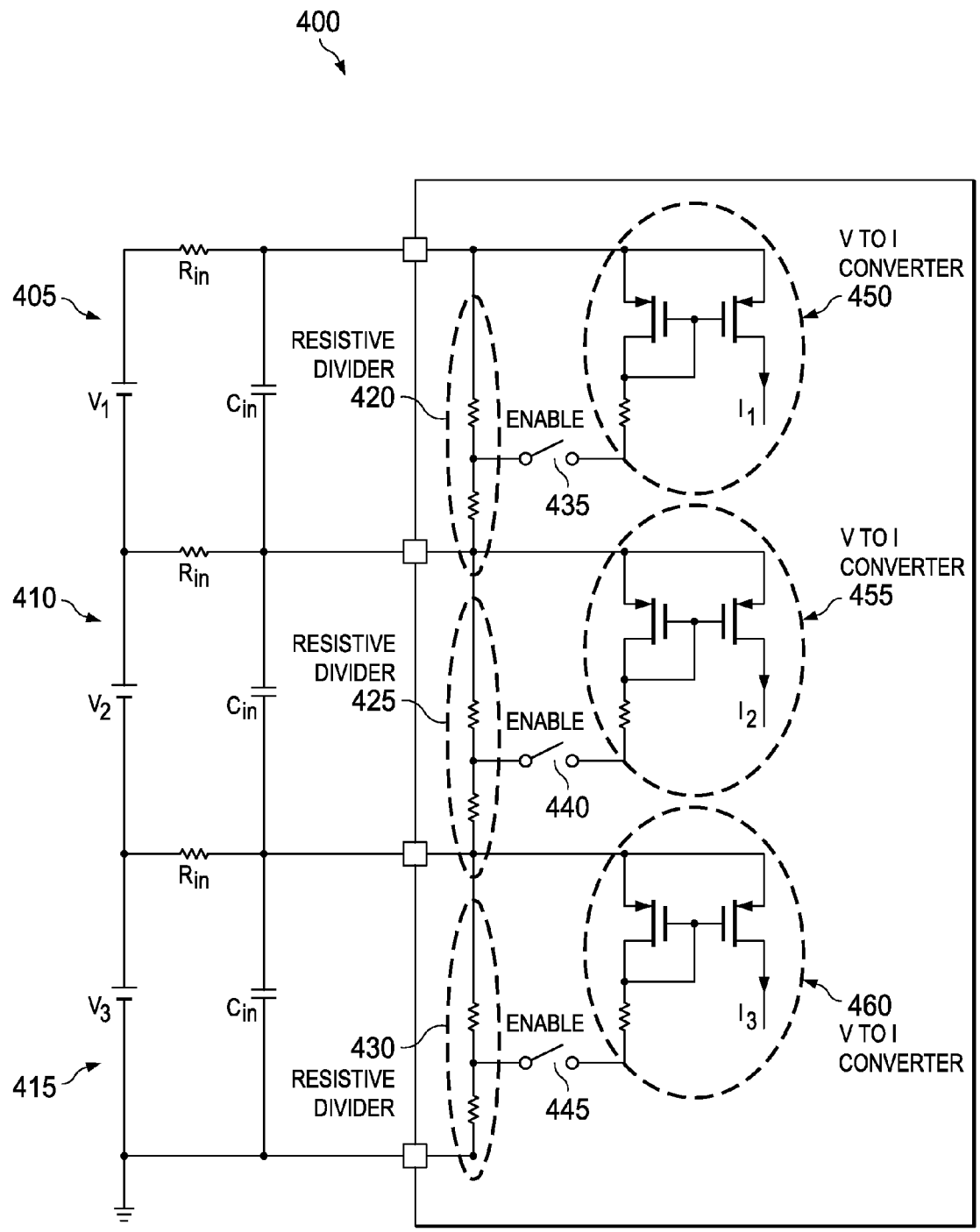
FIG. 4 is a circuit diagram of an example embodiment of the sensing and conversion circuits of FIG. 2 and FIG. 3.

An example embodiment of a three-cell V-to-I converter circuit is provided in FIG. 4. In V-to-I circuit 400, the battery pack comprises battery cells 405, 410, 415. The voltage across cell 405 is converted to a representative current by resistive divider 420, enable switch 435 and V-to-I converter 450. The voltage across cell 410 is converted to a representative current by resistive divider 425, enable switch 440 and V-to-I converter 455. The voltage across cell 415 is converted to a representative current by resistive divider 430, enable switch 445 and V-to-I converter 460. Each V-to-I converter 450, 455, 460 produces respective representative current I1, I2, I3.

Figure 5:
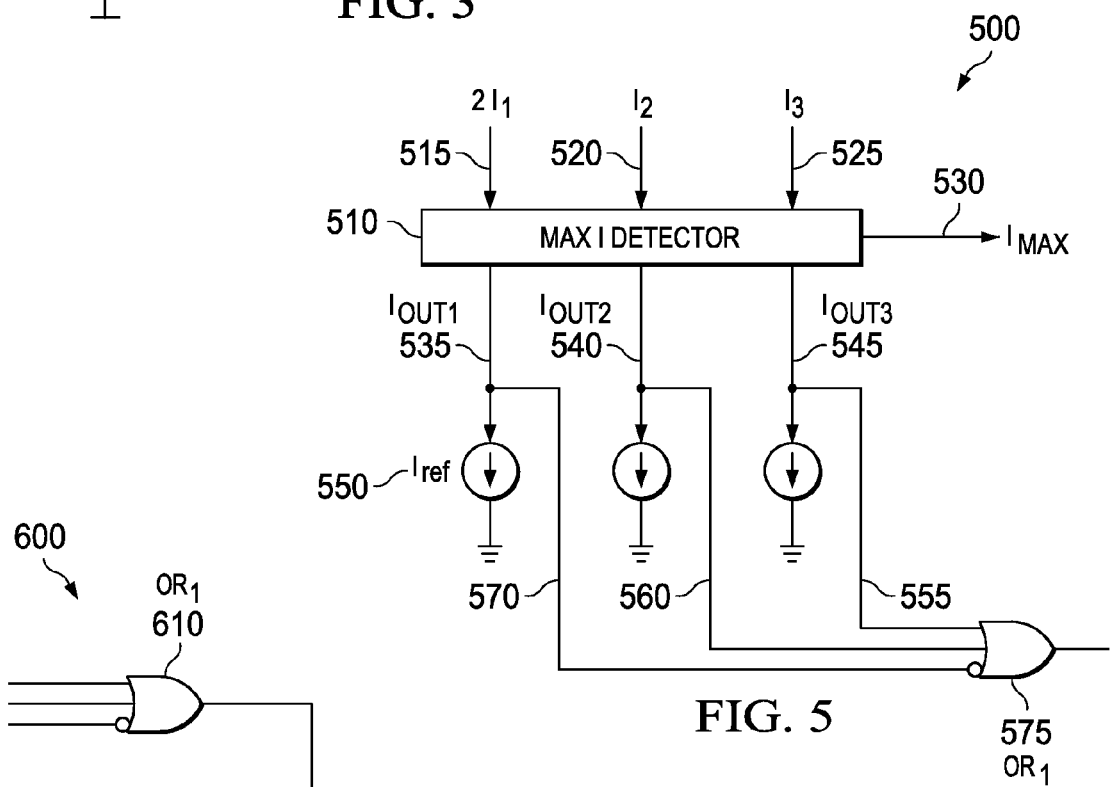
FIG. 5 is a circuit diagram of an example embodiment of a cell anomaly detector of the battery pack of FIG. 1.

Referring now to FIG. 5, in multi-input maximum current (MIMAX) circuit 500, outputs 515, 520, 525 of the V-to-I converters are presented as inputs to multi-input current detector 510 after appropriate gain. In an example embodiment, there is a corresponding separate MIMAX circuit 500 for each V-to-I converter in FIG. 4. Each MIMAX circuit 500 receives the output of each of the V-to-I converters. In the example embodiment of FIG. 5, multi-input current detector 510 receives the output currents I1, I2, I3 from V-to-I converters 450, 455, 460 of FIG. 4. Each MIMAX circuit 500 is associated with one of V-to-I converters 450, 455, 460. The current input from the associated V-to-I converter (I1 in the example embodiment of FIG. 5) is amplified. In this example embodiment, the current, I1, is amplified with a gain of 2. The maximum current of the three input currents 515, 520, 525 in this example embodiment is output at Imax 530. Each input current 515, 520, 525 is replicated as outputs 535, 540, 545. Each of outputs 535, 540, 545 are compared to reference current Iref 550 to produce logic signals 570, 560, 555. Logic signals 555, 560, 570 are then presented as inputs to OR gate 575. The input to OR gate 575 which corresponds to the amplified input, in this example, input 570 is inverted.

Figure 6:
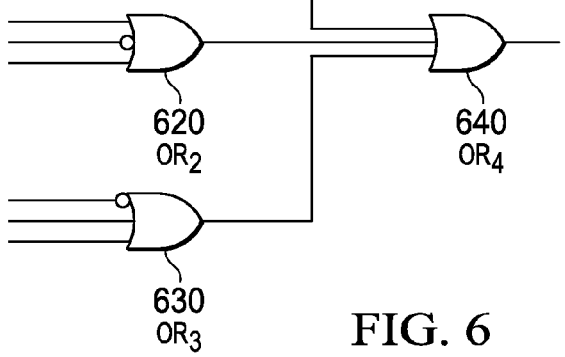
FIG. 6 is a circuit diagram of an example embodiment of a combinational logic circuit of the battery pack of FIG. 1.

Referring to FIG. 6, an example combination logic circuit 600 implements combinational logic to present the determination of an anomalous cell condition. For each of OR gates 610, 620, 630, the input associated with the amplified current is inverted before input to its OR gate. The outputs of OR gates 610, 620, 630 are coupled to the inputs of OR gate 640. Other combination logic circuits may be implemented in combination logic circuit 600 to indicate anomalous conditions.

Figure 7:
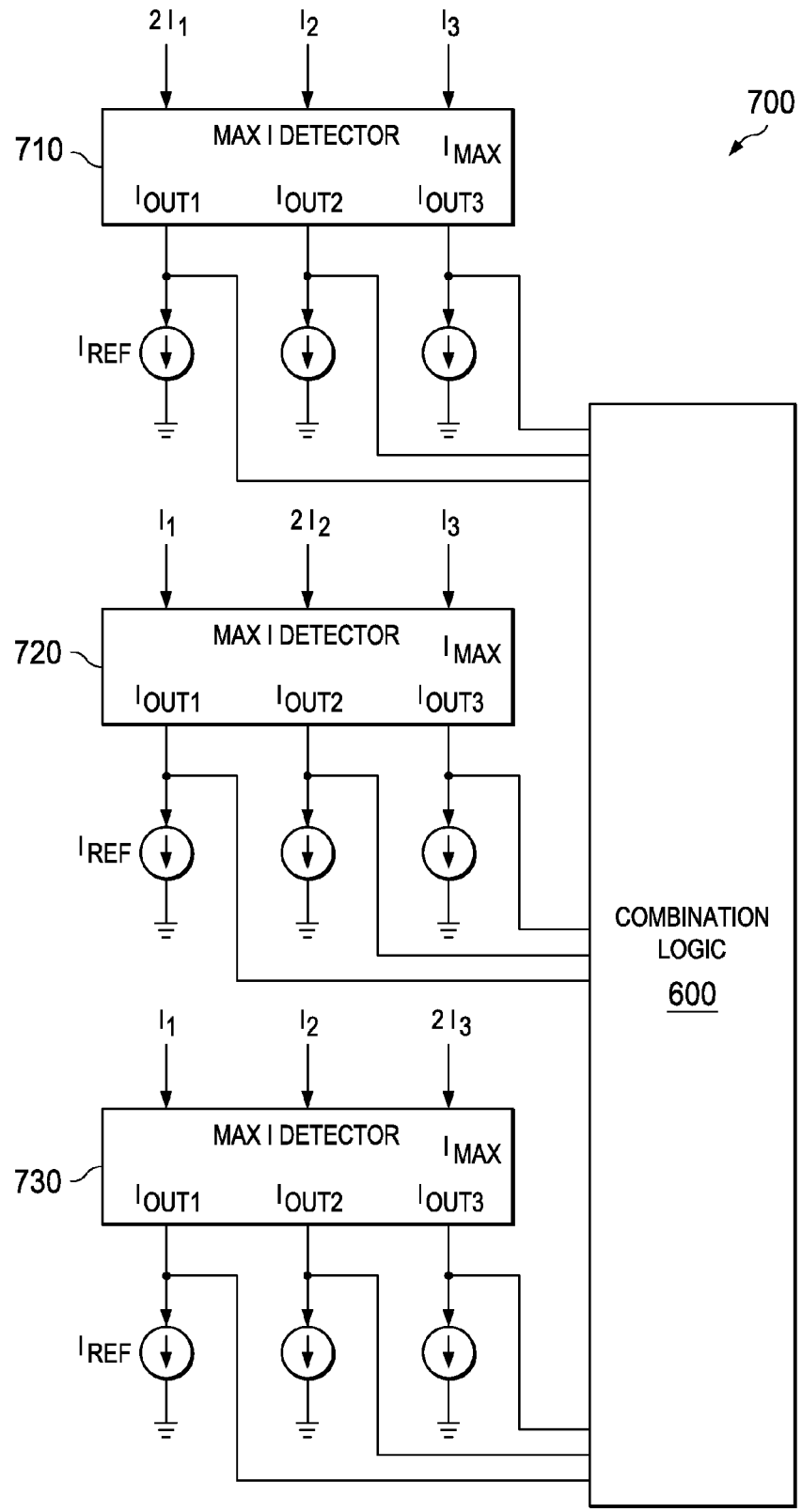
FIG. 7 is a circuit diagram of an example embodiment of the anomaly detection and combinational logic circuits of FIG. 5 and FIG. 6.

The combinational logic circuit for each V-to-I converter, and, therefore, its associated cell is combined into circuit 700 in FIG. 7. In circuit 700, Max I detector 710 determines which of 2I1, I2, and I3 is the maximum current. The outputs of Max I detector 710 are then compared with Iref. Iout1 is inverted and three logic signals corresponding to the three currents, I1, I2, I3 are coupled to combination logic 600. Likewise, detector 720 determines which of I1, 2I2, and I3 is the maximum current. The outputs of Max I detector 720 are then compared with Iref. Iout2 is inverted and three logic signals corresponding to the three currents, I1, I2, I3 are coupled to combination logic 600. Again, detector 730 determines which of I1, I2, and 2I3 is the maximum current. The outputs of Max I detector 730 are then compared with Iref. Iout3 is inverted and three logic signals corresponding to the three currents, I1, I2, I3 are coupled to combination logic 600. The output of combination logic 600 is used for determination of cell anomalies.

The MIMAX circuit of FIG. 7 includes 3 inputs and 4 outputs. The Imax output terminal, provides an output current equal to the max of the input currents, i.e. Imax=max(I1, I2, I3)

The output current from the terminals Iout1, Iout2, and Iout3, is given by

Iout1=0 if I1≠Imax
 Imax if I1=Imax
and
Iout2=0 if I2≠Imax
 Imax if I2=Imax
and
Iout3=0 if I3≠Imax
 Imax if I3=Imax The Iout1, Iout2, and Iout3 outputs are coupled as inputs to a current comparator which determines the presence or absence of a current. Thus, using the max current detector circuit, the maximum input current can be determined and the cell which provides the maximum current can be determined.

In this example embodiment, three max current detector circuits are used whose inputs are
 a. 2I1, I2, I3,
 b. I1, 2I2, I3,
 c. I1, I2, 2I3, The outputs of the current comparator are applied as inputs to combination logic 600 as shown in FIG. 7.

V-to-I converters 235, 240, 245 FIG. 2 are connected across the cell to detect abnormalities using the enable signal 250. V-to-I converters 235, 240, 245 may be periodically connected to reduce power consumption. In an example embodiment, the period of the periodically connected embodiment is 5 s with an on time of 100 ms. When the enable signal is ON, switch 315 of FIG. 3 is closed, and V-to-I converter 235, 240, 245 are connected across the cell to produce a current proportional to the cell voltage. Output current 335 may be used as input to max I detector circuit 500. In this example embodiment, in each of the max detector circuits 500, one of the cell currents is applied with a gain of 2.

During normal operation (no anomalies), when switch 315 is closed, the output of the gates 610, 620, 630 evaluate to low. During normal operation, the output current from each of the cells is approximately equal. Thus, in each of the max detector circuits, the 2-times current input will be the max current. This will cause the current comparator corresponding to it to evaluate to high.

It can be seen from FIG. 5 that current comparator 570 corresponding to the 2× current input is inverted before being applied to OR gate 575. Thus, during normal operation the output of gates 610 and 620 evaluate to low and hence gate 630 will also evaluate to low.

A cell open condition is said to occur when the input resistance (Rin) is greater than a predetermined amount, say 50 kOhm. When this occurs, the output of one of the gates 610, 620, 630 evaluates to high. In one of the max I detector circuits 500, the maximum current will no longer be determined by the input that has a 2-times current input. This in turn will cause gate 640 to evaluate to high. Thus, a cell-anomalous condition may be determined. Similarly, when one of the cell voltages is deeply imbalanced from the other cells by a predetermined amount, gate 640 evaluates to high.

Figure 8:
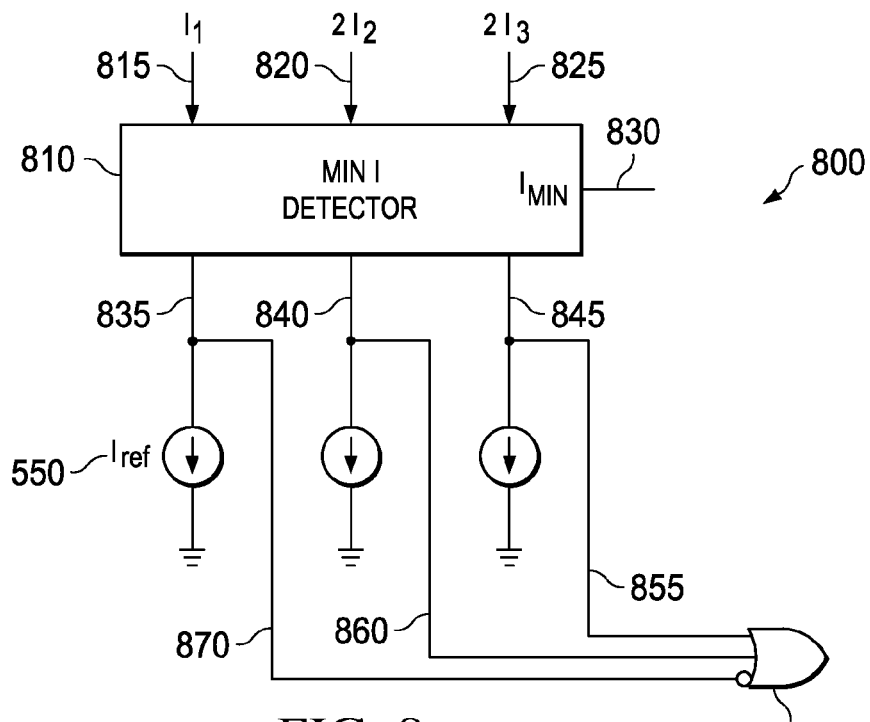
FIG. 8 is a circuit diagram of an example embodiment of a cell anomaly detector of the battery pack of FIG. 1.

In an alternative embodiment, minimum current detector circuit (MIMIN) 800, as provided in FIG. 8, may be implemented to determine an anomalous cell. Inputs 815, 820, 825, which were output from the V-to-I converters, are presented as inputs to multi input min current detector 810 after appropriate gain. In an example embodiment, there is a corresponding separate MIMIN circuit 800 for each V-to-I converter in FIG. 4. Each MIMIN circuit 800 receives the output of each of the V-to-I converters. In the example embodiment of FIG. 8, minimum current detector 810 receives the output currents I1, I2, I3 from V-to-I converters 450, 455, 460 of FIG. 4. Each MIMIN circuit 800 is associated with one of V-to-I converters 450, 455, 460.

The current input from the associated V-to-I converter (I1 in the example embodiment of FIG. 8) is not amplified. In this example embodiment, the currents, I2 and I3, are amplified with a gain of 2. The minimum current of the three input currents 815, 820, 825 in this example embodiment is output at Imin 830. Each input current 815, 820, 825 is replicated as outputs 835, 840, 845. Each of outputs 835, 840, 845 are compared to reference current Iref 850 to produce logic signals 870, 860, 855. Logic signals 855, 860, 870 are then presented as inputs to OR gate 875. The input to OR gate 875 which corresponds to the non-amplified input, in this example, input 870 is inverted.

Figure 9:
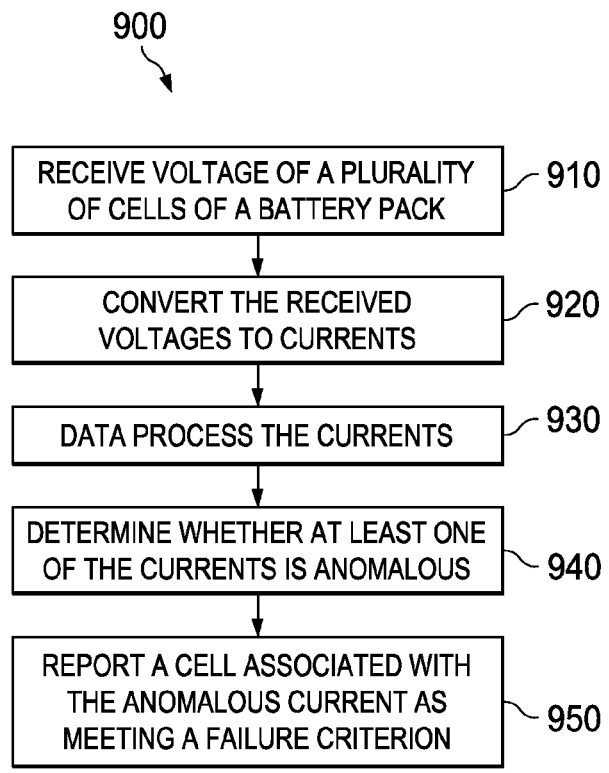
FIG. 9 is a flow chart of an example embodiment of a method of cell anomaly detection used in the battery pack of FIG. 1.

FIG. 9 provides flow chart 900 as an example embodiment of methods of cell anomaly detection. In block 910, the voltages of a plurality of cells of a battery pack are received. In block 920, the received voltages are converted to currents. In block 930, the currents are data processed. In an example embodiment of data processing the currents, each of a plurality of multi-input current detectors is coupled to each of a plurality of V-to-I converters. Each multi-input current detector is configured to determine a maximum current from the input currents. In block 940, the currents are examined to determine whether at least one of the currents is anomalous.

Each multi-input detector is configured to output a logic signal for each of the inputs. Each of the outputs of a particular current detector is coupled to the input of a corresponding OR gate, with the one output of the current detector being inverted. The output of each OR gate is coupled to one OR gate R (gate 640 of FIG. 6), and the output of OR gate R is configured to indicate a fault condition—the anomalous current. In block 950, a cell associated with anomalous current is reported. This may be reported by an indication of which cell of the battery pack has met a failure criterion and is the anomalous cell.

Since the solution is current based, the number of high voltage components required may be reduced as the information processing is performed with currents and ground referenced logic circuits. This solution is scalable to any number of cells as the max detector circuit can be extended for any number of inputs by replicating the basic unit. Additionally, the ground referencing feature allows for all cells of interest to be checked at the same voltage.

The logic of the example embodiment(s) can be implemented in hardware, software, firmware, or a combination thereof. In example embodiments, the logic is implemented in software or firmware that is stored in a memory and that is executed by a suitable instruction execution system. If implemented in hardware, as in an alternative embodiment, the logic can be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc. In addition, the scope of the present disclosure includes embodying the functionality of the example embodiments disclosed herein in logic embodied in hardware or software-configured mediums.

Software embodiments, which comprise an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, or communicate the program for use by or in connection with the instruction execution system, apparatus, or device. The computer readable medium can be, for example but not limited to, an electronic, magnetic, optical, electromagnetic, infrared, or semiconductor system, apparatus, or device. More specific examples (a nonexhaustive list) of the computer-readable medium would include the following: a portable computer diskette (magnetic), a random access memory (RAM) (electronic), a read-only memory (ROM) (electronic), an erasable programmable read-only memory (EPROM or Flash memory) (electronic), and a portable compact disc read-only memory (CDROM) (optical). In addition, the scope of the present disclosure includes embodying the functionality of the example embodiments of the present disclosure in logic embodied in hardware or software-configured mediums.

Therefore, at least the following is claimed:

1. A system comprising:
   a plurality of voltage to current (V-to-I) converters each being couplable to one of a respective plurality of cells;
   a cell detector circuit coupled to each of the plurality of V-to-I converters to receive a current generated by its respective V-to-I converter, wherein the cell detector circuit compares each of the respective plurality of cells with other cells in the plurality of cells by determining a maximum current input to the converters and which cell provides that maximum current to determine if any of the plurality of V-to-I converters provides an anomalous input current and determines which of the plurality of V-to-I converters provides the anomalous input current whereby relative performance between the cells is determined, wherein the cell detector circuit further comprises a plurality of multi-input current detectors, wherein each of the plurality of multi-input current detectors is coupled to each of the plurality of V-to-I converters, and wherein each multi-input current detector compares at least one of the V-to-I converter outputs to a threshold value to determine an anomalous current; and wherein each multi-input detector outputs a logic signal for each of the inputs, each output of the multi-input current detector is coupled to the input of an OR gate.

2. The system of claim 1, wherein at least one of the V-to-I converters comprises a plurality of field effect transistors, bipolar transistors, CMOS transistors, or current mirror devices.

3. The system of claim 1, wherein for each multi-input current detector, one input of each V-to-I converter is amplified.

4. The system of claim 1, wherein for each multi-input current detector, one input of each V-to-I converter is not amplified.

5. The system of claim 1, wherein the cell detector circuit is ground referenced.

6. A battery pack comprising:
   a plurality of cells;
   a plurality of high-value resistor dividers, each high-value resistor divider coupled across one cell of the plurality of cells;
   a plurality of multi-input current detectors, each multi-input current detector coupled to at least one of a plurality of dividers for one cell of the plurality of cells, the multi-input current detector determining the maximum current input to the detectors and which cell provides maximum current and including a current comparator which compares each of the plurality of cells with other cells in the plurality of cells,
   wherein each of the plurality of multi-input current detectors is coupled to each of the plurality of V-to-I converters, and wherein each multi-input current detector compares at least one of the V-to-I converter outputs to a threshold value to determine an anomalous current; and wherein each multi-input detector outputs a logic signal for each of the inputs, each logic signal being coupled to the input of an OR gate for
   determining which cell of the plurality of cells is in a fault condition.

7. The battery pack of claim 6, wherein the battery pack further comprises a plurality of voltage to current (V-to-I) converters, wherein each of the plurality of V-to-I converters converts the voltage to a representative current.

8. The battery pack of claim 7, wherein at least one of the V-to-I converters comprises a plurality of field effect transistors, bipolar transistors, CMOS transistors, or current mirror devices.

9. The battery pack of claim 6, wherein for each multi-input current detector one input of each V-to-I converter is amplified.

10. The battery pack of claim 6, wherein for each multi-input current detector, one input of each V-to-I converter is not amplified.

11. The battery pack of claim 6, wherein the fault condition indicates an input resistance greater than a predetermined input resistance.

12. The battery pack of claim 6, wherein at least one of the plurality of multi-input current detectors is ground referenced.

13. A method comprising:
    receiving voltages across the cells of a plurality of cells of a battery pack;
    converting the received voltages to currents;
    data processing the currents to compare each of the plurality of cells with other cells in the plurality of cells by amplifying one of the currents;
    comparing each of the currents to a predetermined reference current;
    producing a logic level signal for each current based on the comparing; and
    inverting the logic level signal for the current that was amplified;
    determining a maximum current input to the converters and which cell provides that maximum current to determine whether at least one of the currents is anomalous; and
    reporting the at least one anomalous current as indicative meeting a failure criterion.

14. The method of claim 13, wherein the method further comprises the step of determining if any of the inverted logic level signals indicate an anomalous cell voltage.

15. The method of claim 13, wherein the step of data processing the currents is performed using a ground referenced circuit.

16. A method comprising:
    receiving voltages across the cells of a plurality of cells of a battery pack;
    converting the received voltages to currents;
    data processing the currents to compare each of the plurality of cells with other cells in the plurality of cells;

determining a maximum current input to the converters and which cell provides that maximum current to determine whether at least one of the currents is anomalous; and reporting the at least one anomalous current as indicative meeting a failure criterion, wherein the step of data processing the currents further comprises:

amplifying all but one of the currents;

comparing each of the currents to a predetermined reference current;

producing a logic level signal for each current based on the comparing; and inverting the logic level signal for the current that was not amplified.

17. The method of claim 16, wherein the method further comprises the step of determining if any of the inverted logic level signals indicate an anomalous cell voltage.

* * * * *